US008315040B2

(12) United States Patent
Roberts et al.

(10) Patent No.: US 8,315,040 B2
(45) Date of Patent: Nov. 20, 2012

(54) PROTECTIVE ENCLOSURE FOR MODEL VEHICLE

(75) Inventors: Timothy E. Roberts, Rockwall, TX (US); Jon Kenneth Lampert, Garland, TX (US); Otto Karl Allmendinger, Rowlett, TX (US)

(73) Assignee: Traxxas LP, Plano, TX (US)

( * ) Notice: Subject to any disclaimer, the term of this patent is extended or adjusted under 35 U.S.C. 154(b) by 462 days.

(21) Appl. No.: 11/872,872

(22) Filed: Oct. 16, 2007

(65) Prior Publication Data

US 2009/0097191 A1 Apr. 16, 2009

(51) Int. Cl.
*A63H 17/26* (2006.01)
*H05K 5/00* (2006.01)

(52) U.S. Cl. ............. 361/679.01; 446/78; 446/269; 446/431; 446/439; 446/470; 446/484; 361/622; 361/679.4; 361/679.58; 361/725; 361/728

(58) Field of Classification Search ............... 446/78, 446/269, 431, 439, 484, 470; 361/679.01, 361/725, 728, 622, 679.58, 679.4
See application file for complete search history.

(56) References Cited

U.S. PATENT DOCUMENTS

| 3,187,462 | A  | * | 6/1965  | Licitis ........................... 446/439 |
| 3,879,255 | A  | * | 4/1975  | Mason et al. .................. 156/527 |
| 4,850,884 | A  | * | 7/1989  | Sawai et al. ................... 439/76.2 |
| 5,088,010 | A  | * | 2/1992  | Wimmer et al. ............... 361/809 |
| 6,364,736 | B1 | * | 4/2002  | Lee ................................ 446/463 |
| 6,575,809 | B2 | * | 6/2003  | Ogawa et al. ................. 446/444 |
| 6,602,089 | B2 | * | 8/2003  | Abe et al. ....................... 439/404 |
| 7,377,295 | B2 | * | 5/2008  | Byers et al. ..................... 141/98 |
| 7,497,757 | B2 | * | 3/2009  | Hamasaki ........................ 446/78 |
| 7,835,634 | B2 | * | 11/2010 | Berend et al. .................. 396/27 |

* cited by examiner

*Primary Examiner* — Gene Kim
*Assistant Examiner* — Alexander Niconovich
(74) *Attorney, Agent, or Firm* — Carr LLP

(57) ABSTRACT

The present invention provides for a protective enclosure comprising a base comprising a first continuous mating surface and at least one conveyance aperture, a cover comprising a second continuous mating surface, wherein the second continuous mating surface is configured to form a seal with the first continuous mating surface, and a clamp, wherein at least a portion of the clamp is coupleable to the base, wherein a mouth of the clamp is configured to be offset from the aperture when the clamp is coupled to the base, wherein the clamp comprises a first sealing layer, and wherein the clamp is configured to seal the aperture against contaminants. The protective enclosure may be configured for use in a remotely controllable model vehicle to protect a control module.

33 Claims, 7 Drawing Sheets

PROTECTIVE ENCLOSURE FOR MODEL VEHICLE

BACKGROUND OF THE INVENTION

1. Field of the Invention

The present invention relates to protective enclosures and, more particularly, to protective enclosures having provision for transverse conveyances.

2. Description of the Related Art

Remotely controllable model cars are generally designed to operate on land, and are often designed to be maintainable and modifiable by untrained users. Thus, control modules, including receiver electronics packages, electronic sensors and mechanical sensors, are typically susceptible to damage from contaminants such as water, mud, dirt and snow. A permanently sealed enclosure, which could protect a control module from contaminants while permitting a transverse conveyance, i.e. a wire or a tube passing from the inside to the outside, would complicate modification and repair by a typical user.

Assembly, modification and repair of a remotely controllable car may include the addition, removal and/or substitution of control modules, which may result in the use of a different number of wires and tubes entering a protective enclosure, as well as the use of wires and tubes of differing diameters. Consequently, there exists a need for a protective enclosure that protects a control module from contaminants while permitting transverse conveyances of differing sizes and varying numbers, and also retains its sealing properties, despite multiple episodes of opening and closing the enclosure.

SUMMARY OF THE INVENTION

The present invention provides protective enclosure that protects a control module from contaminants while permitting entry of transverse conveyances while retaining its sealing properties.

BRIEF DESCRIPTION OF THE DRAWINGS

For a more complete understanding of the present invention and the advantages thereof, reference is now made to the following Detailed Description taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, specific details, and the like have been omitted inasmuch as such details are not considered necessary to obtain a complete understanding of the present invention, and are considered to be within the understanding of persons of ordinary skill in the relevant art.

Figure 1:
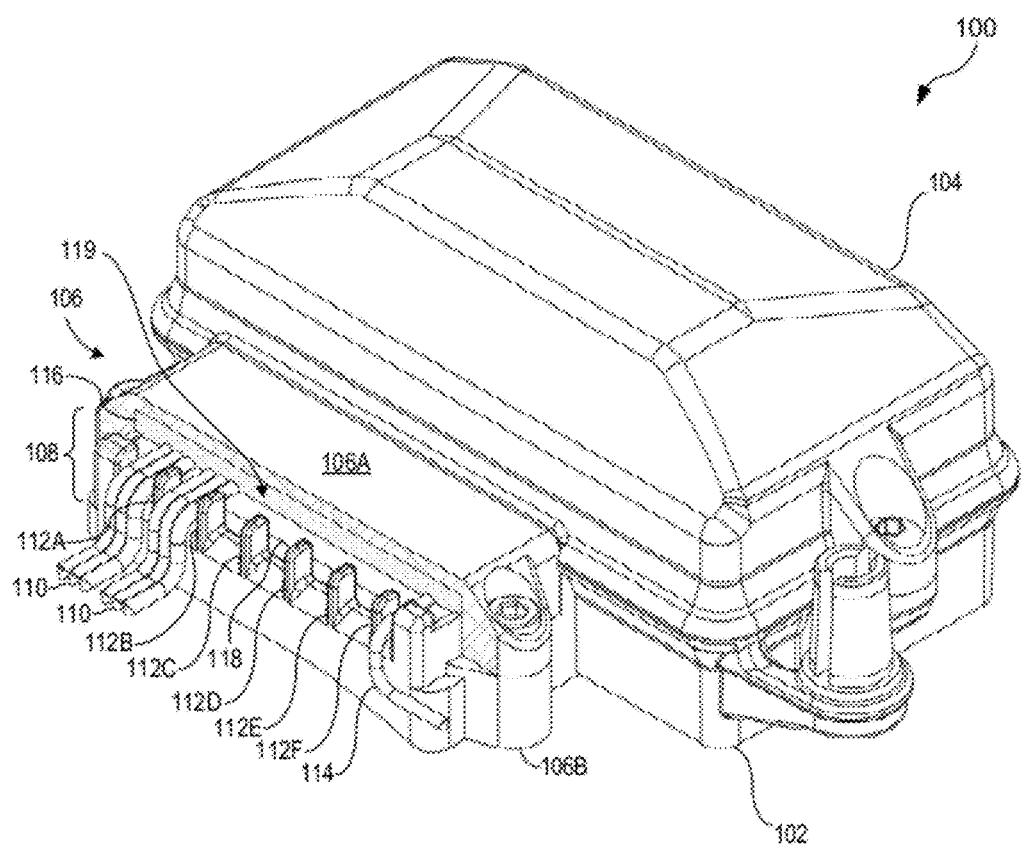
FIG. 1 illustrates a perspective view of an embodiment of a protective enclosure.

Turning now to FIG. 1, the reference numeral 100 generally indicates an embodiment of a protective enclosure. In the illustrated embodiment, protective enclosure 100 comprises a base 102, a cover 104 and a clamp 106. Clamp 106, which may provide strain relief to transverse conveyances, comprises a top portion 106a and a bottom portion 106b, and has a mouth 108, through which conveyances, such as ribbon cables 110 and a wire 114 may traverse the enclosure 100. It should be understood that enclosure 100 may comprise a single piece of material, in which, for example, clamp portions 106a and 106b are already connected to cover 104 and base 102, respectively, and cover 104 and base 102 are hinged. Alternatively, enclosure 100 may multiple pieces, in which, for example, base 102, cover 104, top clamp portion 106a and bottom clamp portion 106b comprise separate portions that are coupleable, i.e. configured to be assembled together. The embodiment illustrated in FIG. 1, however, shows bottom clamp portion 106b and base 102 as a single piece to which cover 104 and top clamp portion 106a are coupleable. It should be further understood that transverse conveyances may include tubes, such as vacuum hose, pressurized hose, or tubes encasing movable cables.

Enclosure 100, as illustrated, is configured to house a control device for a model vehicle, for example a remotely controllable model car, in an environment protected from contaminants, such as water, mud, dirt and snow. The control device may comprise an electronic module, such as a receiver, transmitter, sensor, switch or power supply, a mechanical module, such as a gear, lever or valve assembly, and/or an electromechanical module, such as a motor, generator, or mechanically operated electrical switch. Some embodiments of enclosure 100 may house multiple modules.

Figure 2:
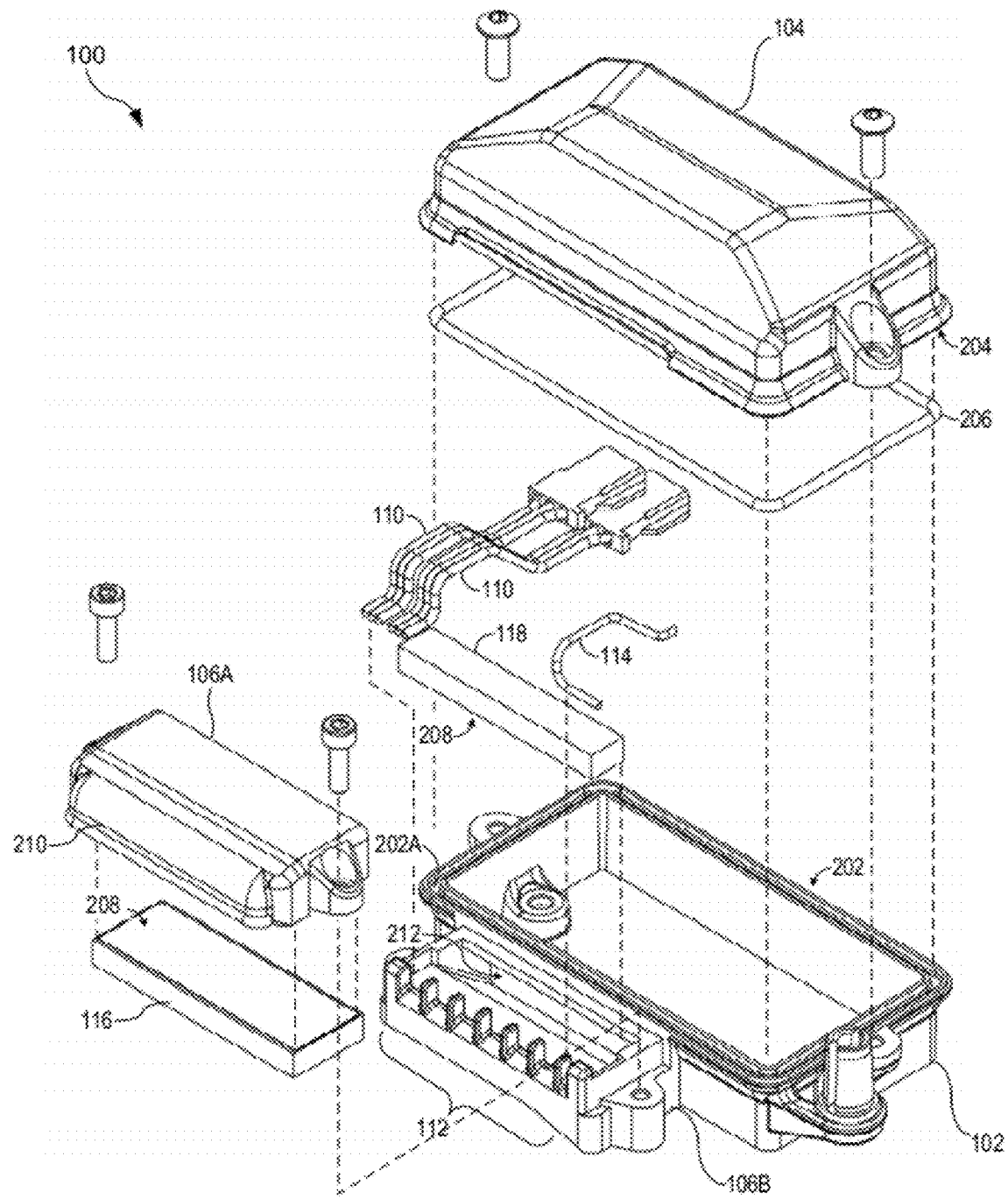
FIG. 2 illustrates an exploded assembly view of the protective enclosure of FIG. 1.
Figure 5:
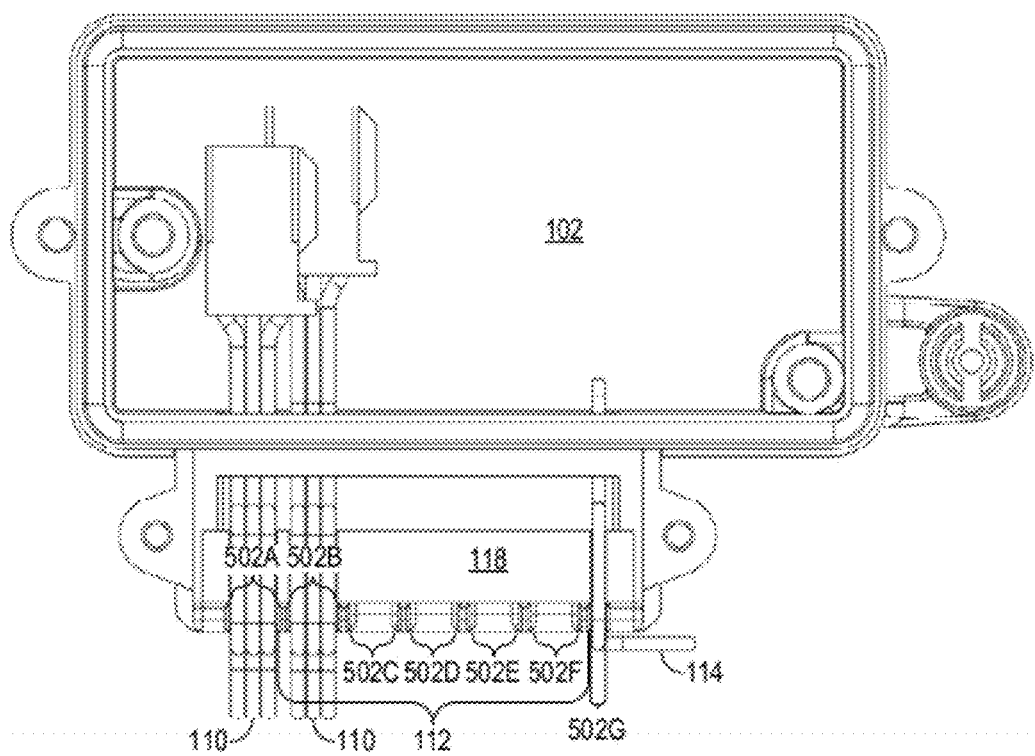
FIG. 5 illustrates a top interior view of the protective enclosure of FIG. 1.

FIG. 1 further illustrates conveyance alignment guides 112A-F adjacent to mouth 108 of clamp 106. In order to illustrate conveyance alignment guides 112A-F, enclosure 100 is illustrated with a splash shield 210 cut away. Splash shield 210 is illustrated in FIG. 2. The set of conveyance alignment guides 112, also shown in FIG. 2, forms a set of sub-apertures 502A-502G across mouth 108. Sub-apertures 502A-502G are indicated in FIG. 5 for improved clarity, and are illustrated as having non-identical widths. Conveyance alignment guides 112A-G align transverse conveyances, including ribbon cables 110 and wire 114, in clamp 106. In the illustrated embodiment, conveyance alignment guide 112A and 112B restrict motion of ribbon cables 110, and conveyance alignment guide 112F restricts motion of wire 114. In some embodiments, sub-apertures 502A-502G are sized such that the insulation or other external housings of transverse conveyances effectively blocks out contaminants, forming a seal. For example, if gaps between the outside of wire 114 and the interior of sub-aperture 402G are small enough, contaminants are unlikely to pass through the gaps and into the inside of enclosure 100. Thus, for some embodiments, the set of conveyance alignment guides 112 may form a sealing layer for clamp 106. Grommets and/or other flexible sealing material, such as room temperature vulcanizing (RTV) rubber, around transverse conveyances may provide further sealing.

In FIG. 1, clamp 106 is also illustrated as comprising flexible layers 116 and 118, which also form sealing layers. In some embodiments flexible layer 116 and/or flexible layer 118 comprise foam rubber, although other compressible materials may be used. When assembled with ribbon cables 110 and wire 114 in place, flexible layers 116 and 118 compress and conform to the shapes and sizes of the transverse conveyances. For example, flexible layers 116 and 118 form a seal 119 to prevent contaminants from entering enclosure 100, even when ribbon cables 110 and wire 114 pass through mouth 108 of clamp 106. It should be understood that flexible layers 116 and 118 are able to form the seal 119 even where ribbon cables 110 and wire 114 have differing diameters, or have been moved from one of sub-apertures 502A-502G to another. Thus, the illustrated embodiment of enclosure 100 comprises at least three sealing layers: the set of conveyance alignment guides 112, flexible layer 116 and flexible layer 118. However, it should be understood that some embodiments may comprise a greater or lesser quantity of sealing layers.

As illustrated, the set of conveyance alignment guides 112 is able to deflect contaminants from at least a portion of flexible layers 116 and 118, thereby forming a protective shield for flexible layers 116 and 118. In some embodiments, flexible layers 116 and 118 are constructed with materials that may degrade with age, exposure to contaminants, and repeated opening and closing of clamp 106. The protective nature of conveyance alignment guides 112A-G can extend the lifespan of flexible layers 116 and 118. Further, to ensure durability, some embodiments of enclosure 100 use replaceable flexible layers 116 and 118.

FIG. 2 illustrates an exploded assembly view of enclosure 100. In the illustrated embodiment, splash shield 210 is attached to top clamp portion 106A, although it should be understood that splash shield 210 may be a separate piece, coupleable to enclosure 100. Splash shield 210 obscures at least a portion of mouth 108 of clamp 106 to deflect contaminants away from mouth 108, further protecting flexible layers 116 and 118. An adhesive strip 208 is illustrated on flexible layer 116, which affixes flexible layer 116 to clamp top portion 106A. Another adhesive strip 208 on the underside of flexible layer 118 affixes flexible layer 118 to bottom clamp portion 106B. In the illustrated embodiment, when flexible layer 116 or 118 becomes worn, it may be replaced by pulling it out and affixing the replacement layer 116 or 118 in place using adhesive strip 208.

Base 102 comprises a conveyance aperture 212, which permits ribbon cables 110 and wire 114 to traverse enclosure 100, passing from the inside to the outside. Aperture 212 is configured to be offset from mouth 108 of clamp 106, illustrated as aperture 212 being vertically offset and below the expected location of mouth 108, when clamp 106 is assembled. It should be understood, however, that a different offset, such as a horizontal or diagonal offset, may be used. Ribbon cables 110 and wire 114 are illustrated as bent as they would be when enclosure 100 is assembled. It can be seen in FIG. 2 that the relative positions and orientations of aperture 212, clamp 106 and splash shield 210 force ribbon cables 110 and wire 114 through a curved path, having a total bend of greater than 90 degrees, although this total bend is comprised of multiple bends, each of which may be less than 90 degrees. This curved path further protects the inside of enclosure 100 from the likelihood of contamination through aperture 212. Aperture 212 is therefore sealed against contaminants by clamp 106.

The illustrated embodiment of enclosure 100 further comprises a gasket 206, illustrated as a compressible, replaceable ring, although other embodiments may comprise different removable and/or permanent gasket types. Gasket 206 is compressed between mating surfaces 202 and 204 on base 102 and cover 104, respectively. Mating surfaces 202 and 204 are illustrated as continuous, having no gaps or notches for transverse conveyances. Mating surfaces 202 and 204 are configured to form a seal in order to keep contaminants out of enclosure 100 when cover 104 and base 102 are coupled together. In the illustrated embodiment, mating surface 202 comprises a channel 202A, which is configured to retain gasket 206 in place during assembly.

Figure 3:
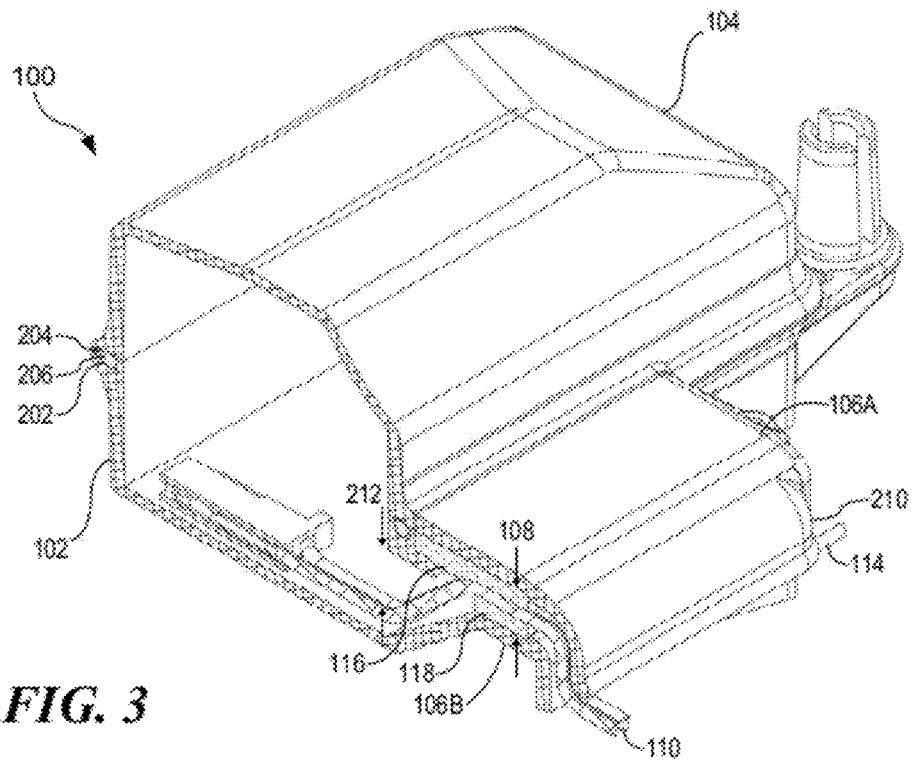
FIG. 3 illustrates a cutaway perspective view of the protective enclosure of FIG. 1.

FIG. 3 illustrates a cutaway perspective view of enclosure 100, as assembled. A ribbon cable 110 is illustrated traversing enclosure 100, bending more than 90 degrees as it passes through aperture 212, mouth 108 of clamp 106, which is offset from aperture 212, and beneath splash shield 210. Mating surfaces 202 and 204 are illustrated forming a seal that includes gasket 206.

Figure 4:
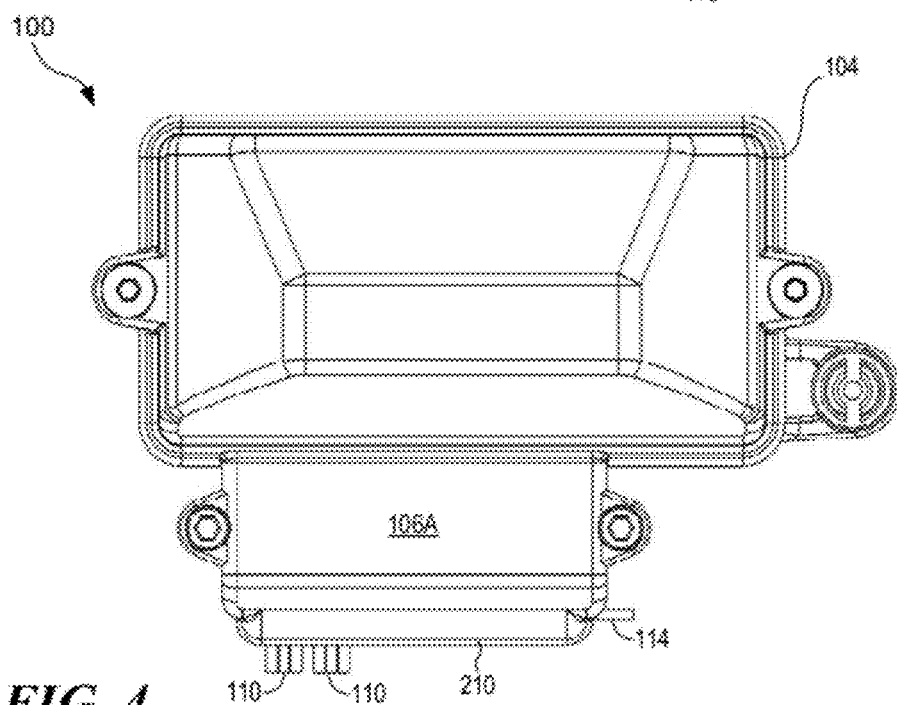
FIG. 4 illustrates a top view of the protective enclosure of FIG. 1.

FIG. 4 illustrates a top view of enclosure 100, as assembled, with ribbon cables 110 and wire 114 traversing enclosure 100. FIG. 5 illustrates a cutaway top view of enclosure 100, showing the interior of base 102, with cover 104 and top clamp portion 106A removed. Sub-apertures 502A-G, formed adjacent to mouth 108 of clamp 106 by the set of conveyance alignment guides 112, are identified. Ribbon cables 110 and wire 114 are illustrated passing above flexible layer 118.

Figure 6:
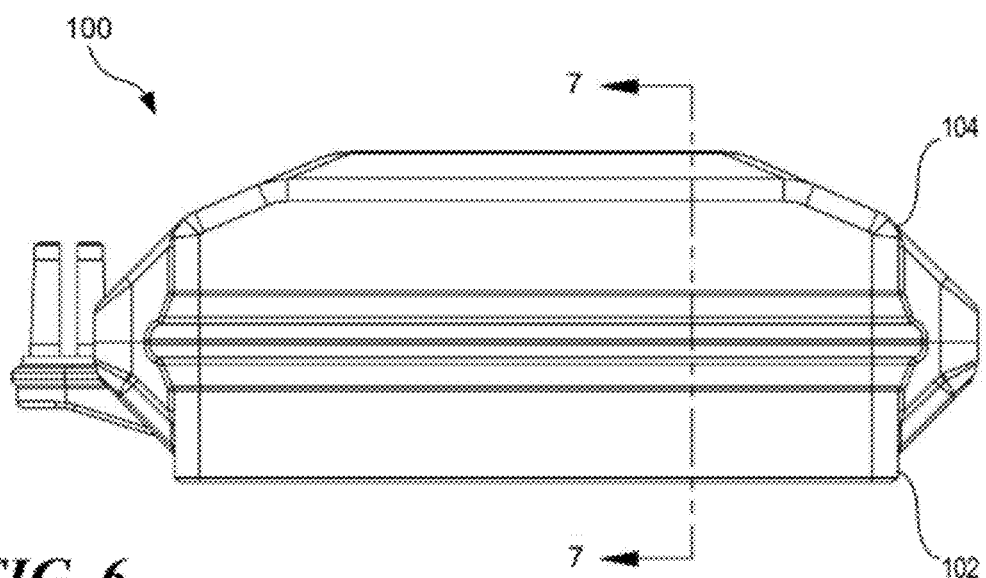
FIG. 6 illustrates a rear view of the protective enclosure of FIG. 1.
Figure 7:
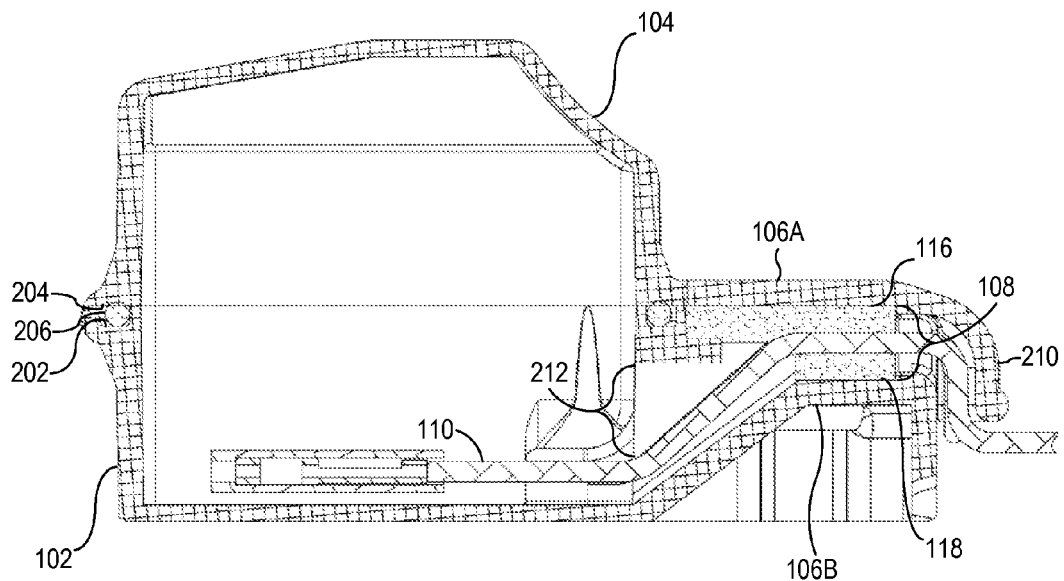
FIG. 7 illustrates a cutaway side view of the protective enclosure of FIG. 1.

FIG. 6 illustrates a rear view of enclosure 100, indicating plane 7 used for the cutaway side view of FIG. 7. In FIG. 7, enclosure 100 is illustrated as assembled, with ribbon cables 110 passing through aperture 212, disposed between flexible layers 116 and 118, and bending downward to pass out of mouth 108 and past splash shield 210.

Figure 8:
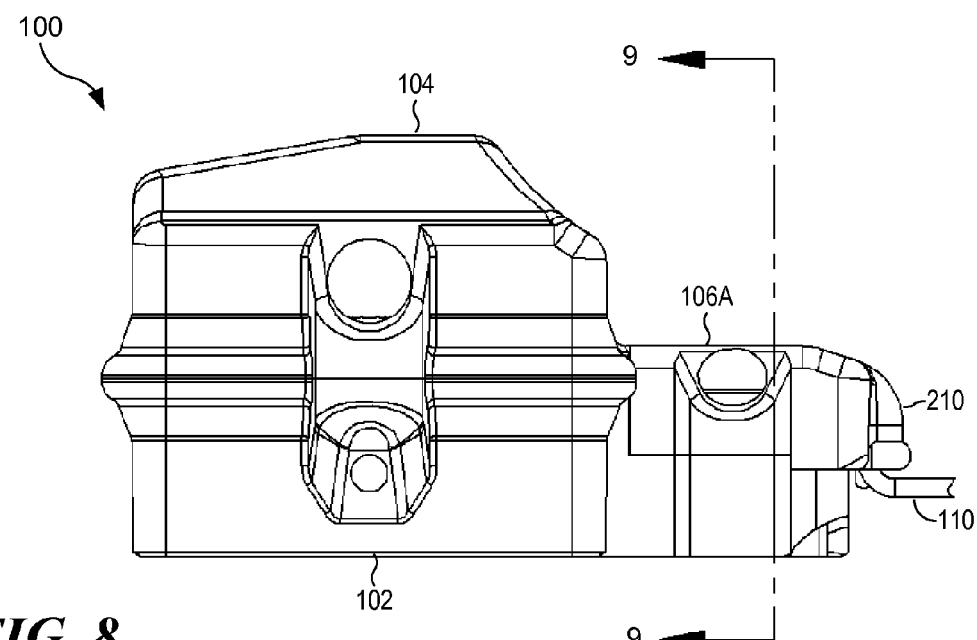
FIG. 8 illustrates a side view of the protective enclosure of FIG. 1.
Figure 9:
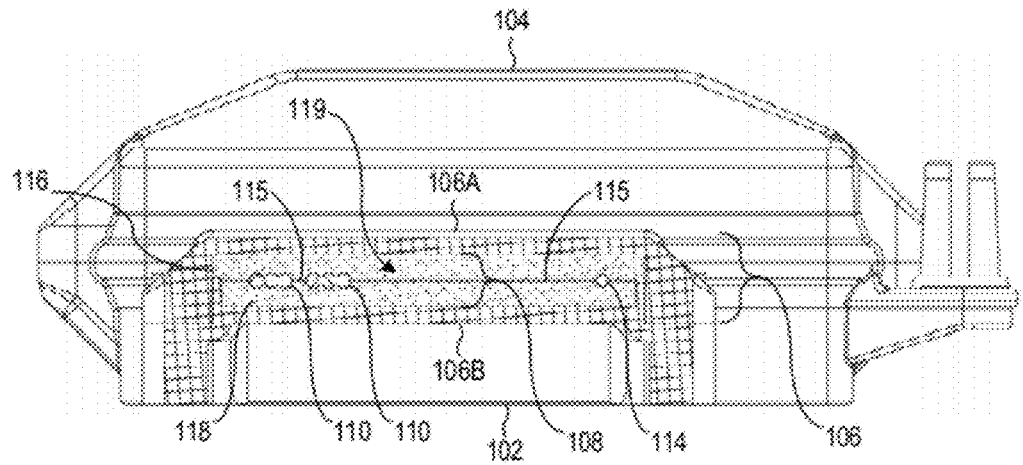
FIG. 9 illustrates a cutaway front view of the protective enclosure of FIG. 1.

FIG. 8 illustrates a side view of enclosure 100, indicating plane 9 used for the cutaway front view of FIG. 7. Plane 9 is between splash shield 210 and base 102. In FIG. 9, ribbon cables 110 and wire 114 are illustrated as passing between flexible layers 116 and 118. Flexible layers 116 and 118 of the seal 119 compress to conform to the shapes and sizes of Ribbon cables 110 and wire 114, sealing gaps 115 in order to protect the interior of enclosure 100 from contaminants.

Figure 11:
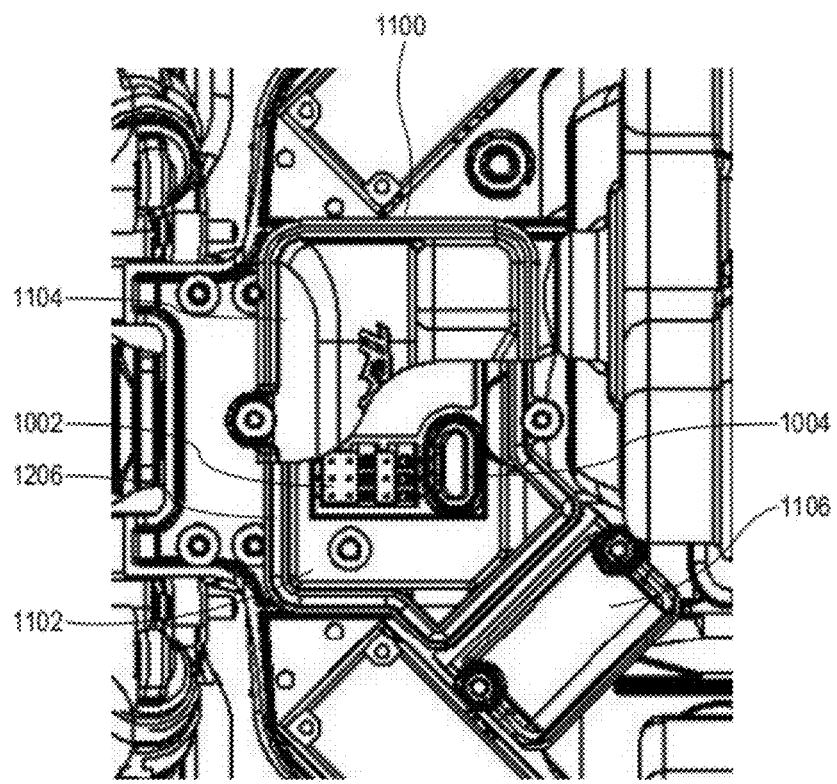
FIG. 11 illustrates a cutaway view of the protective enclosure of FIG. 10.
Figure 10:
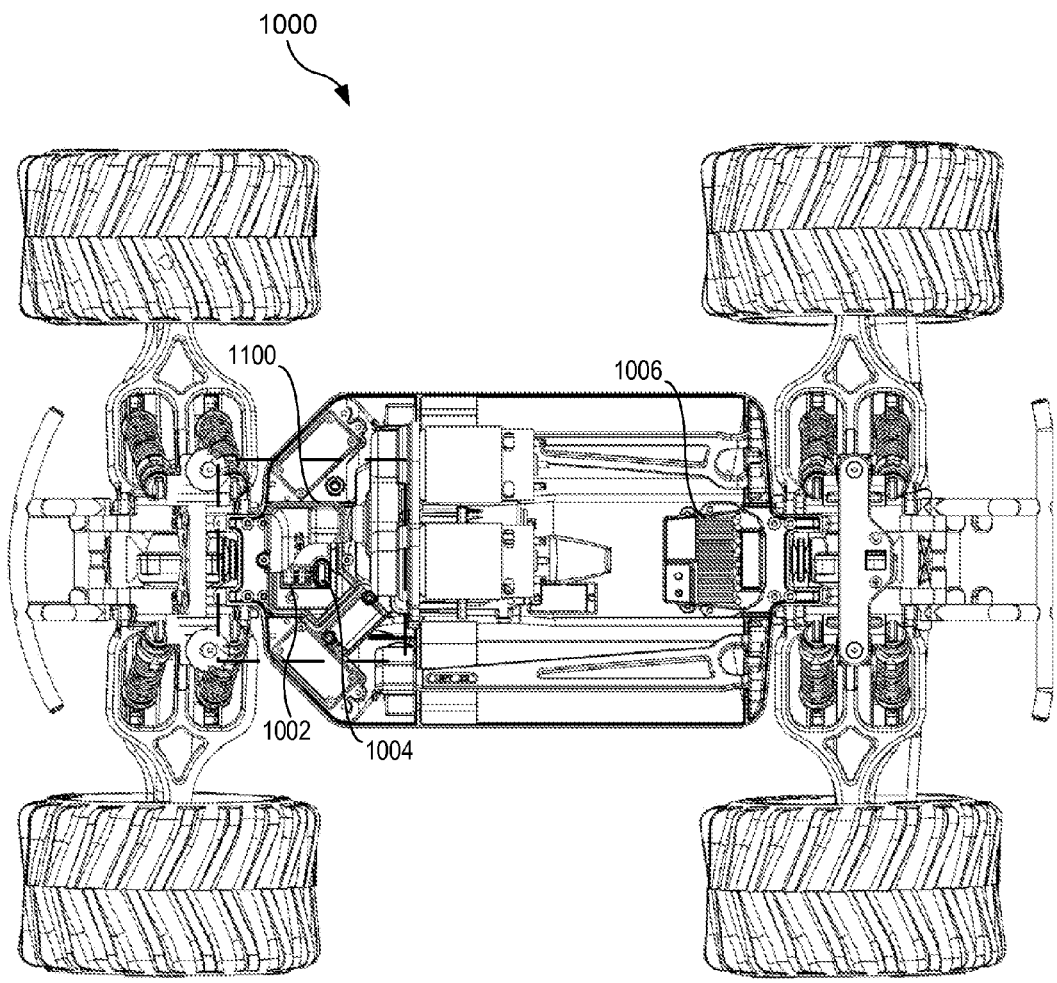
FIG. 10 illustrates an embodiment of a remotely controllable car comprising another embodiment of a protective enclosure.

FIG. 10 illustrates an embodiment of a remotely controllable car 1000 with another embodiment of a protective enclosure 1100. Remotely controllable car 1000 also comprises a drive train 1006, which is controlled by control devices 1002 and 1004 inside enclosure 1100. FIG. 11 illustrates a close-up cutaway view of enclosure 1100, which comprises a base 1102, a cover 1104, a gasket 1206 and a clamp 1106. It should be understood that remotely controllable car 1000 may comprise multiple protective enclosures 100 and/or 1100. It should be further understood that control devices 1002 and 1004 may be electronic, mechanical and/or electromechanical modules, and that a greater or lesser quantity may be used.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A protective enclosure comprising:
   a base comprising a first continuous mating surface and at least one conveyance aperture configured for passage between the inside of the enclosure and the outside of the enclosure of at least one conveyance, wherein the at least one conveyance comprises one or more wires separated from immediate surroundings and preventing passage of contaminants past or between the one or more wires by electrical insulation material encasing the one or more wires;
   a cover comprising a second continuous mating surface, wherein the second continuous mating surface is configured to form a seal with the first continuous mating surface; and
   a clamp comprising a mouth having an upper mouth portion and a lower mouth portion, wherein at least a portion of the clamp is coupleable to the base, wherein the mouth of the clamp is configured to be offset from the aperture when the clamp is coupled to the base,
   wherein the clamp further comprises a first seal having at least a portion compressed by the upper mouth portion and the lower mouth portion within the mouth of the clamp, and wherein the first seal is configured with one or more flexible surfaces to conform around at least a portion of opposite sides of the at least one conveyance traversing the mouth to seal the aperture against contaminants.

2. The protective enclosure of claim 1 further comprising:
   a splash shield, wherein the splash shield obscures at least a portion of the mouth of the clamp.

3. The protective enclosure of claim 2 wherein a combination of the aperture, the clamp and the splash shield is configured to force a conveyance through a total bend of greater than 90 degrees.

4. The protective enclosure of claim 1 further comprising:
   at least one conveyance alignment guide adjacent to the mouth of the clamp.

5. The protective enclosure of claim 1 wherein the first seal comprises a set of one or more conveyance alignment guides adjacent to the mouth of the clamp.

6. The protective enclosure of claim 1 wherein the first seal comprises a first sealing layer of flexible material.

7. The protective enclosure of claim 6 wherein the first sealing layer further comprises an adhesive strip for affixing the first sealing layer to the upper mouth portion of the clamp.

8. The protective enclosure of claim 6 further comprising:
   wherein the first seal comprises a second sealing layer, wherein the second sealing layer is configured to form the first seal with the first sealing layer.

9. The protective enclosure of claim 1 further comprising:
   a gasket, wherein at least one of the first and second continuous mating surfaces comprises a channel configured to retain the gasket.

10. The protective enclosure of claim 1 wherein the enclosure is configured to hold a control device for a model vehicle.

11. The protective enclosure of claim 10 wherein the control device comprises at least one selected from the list comprising: an electronic module, a mechanical module and an electromechanical module.

12. The protective enclosure of claim 1 wherein the clamp is further configured to seal the aperture against contaminants when a conveyance passes through the mouth of the clamp.

13. A protective enclosure for a remotely controllable model car electronics package, the enclosure comprising:
   a housing for an electronic device comprising an enclosure seal and at least one conveyance aperture configured to allow at least one conveyance to pass between the inside of the housing and the outside of the housing to couple to the electronic device without disturbing the enclosure seal, wherein the at least one conveyance comprises one or more wires separated from immediate surroundings and preventing passage of contaminants past or between the one or more wires by electrical insulation material encasing the one or more wires;
   a clamp, wherein the clamp is coupleable to the housing for sealing the at least one conveyance aperture;
   wherein the clamp comprises a mouth having an upper mouth portion and a lower mouth portion, and wherein the mouth, when the upper mouth portion and the lower mouth portion are in a clamped position, is configured to be offset from the conveyance aperture; and
   wherein the clamp further comprises a first seal configured to have at least a portion compressed between the upper mouth portion and the lower mouth portion within the mouth of the clamp, and wherein the first seal comprises one or more flexible surfaces configured to conform around at least a portion of opposites sides of the at least one conveyance.

14. The protective enclosure of claim 13, wherein the clamp further comprises alignment guides positioned adjacent to the mouth of the clamp to form a protective shield for the first seal.

15. The protective enclosure of claim 14, wherein the alignment guides form a set of sub-apertures across the mouth of the clamp.

16. The protective enclosure of claim 15, wherein each sub-aperture formed by the alignment guides each have a width substantially equal to a width of a conveyance to seal off contaminants from entering the housing.

17. The protective enclosure of claim 16, comprising a first sub-aperture configured to receive a first conveyance and a second sub-aperture configured to receive a second conveyance; and
   wherein the first sub-aperture is configured with a different width than the second sub-aperture, wherein the width of the first sub-aperture is substantially equal to a width of at least the first conveyance and the width of the second sub-aperture is substantially equal to a width of at least the second conveyance for sealing the protective enclosure from contaminants.

18. The protective enclosure of claim 13, wherein the first seal of the clamp further comprises a first sealing layer and a second sealing layer configured to have at least a flexible portion of each compressed between the upper mouth portion and the lower mouth portion within the mouth of the clamp to conform the first sealing layer and the second sealing layer around at least a portion of opposite sides of the at least one conveyance.

19. The protective enclosure of claim 18, wherein the first sealing layer and the second sealing layer are replaceable or flexible or both.

20. A protective enclosure comprising:
   an enclosure member comprising an enclosed space within walls of the enclosure member;

at least one conveyance aperture extending through a wall of the enclosure member, the conveyance aperture configured to allow at least one conveyance to pass from the inside of the enclosed space through the conveyance aperture to the outside of the enclosed space, wherein the at least one conveyance comprises one or more wires separated from immediate surroundings and preventing passage of contaminants past or between the one or more wires by electrical insulation material encasing the one or more wires;

a clamp comprising:
  a first clamp surface and a second clamp surface;
  wherein at least a portion of each of the first clamp surface and the second clamp surface is configured to be positioned in a clamped position forming a clamp mouth around at least a portion of the at least one conveyance extending through the conveyance aperture, the clamp mouth restricting the passage of contaminants; and
  wherein the first clamp surface is movable from the clamped position forming the clamp mouth to an unclamped position relatively farther from the second clamp surface releasing the at least one conveyance from the clamp mouth;

a first seal comprised of compressible sealing material having one or more flexible surfaces wherein the sealing material of the first seal is compressed between the first clamp surface and the second clamp surface, wherein the flexible surfaces of the first seal are configured to conform around at least a portion of opposite sides of the at least one conveyance within the clamp mouth when the first clamp surface is in the clamped position to restrict passage of contaminants into the enclosed space beyond the clamp mouth; and wherein the clamp mouth, when the first clamp surface is in the clamped position, is configured to be offset from the conveyance aperture.

21. The protective enclosure of claim 20, wherein the mouth of the clamp comprises a mouth centerpoint comprising a point substantially centered in a portion of an outer perimeter of the clamp mouth nearest to the conveyance aperture;
  wherein the conveyance aperture of the enclosure member comprises an aperture perimeter nearest to the clamp mouth;
  wherein an aperture centerpoint comprises a point substantially centered within the aperture perimeter; and
  wherein the clamp mouth, when the first clamp surface is in the clamped position, is configured to be offset from the conveyance aperture by displacement of the mouth centerpoint from the aperture centerpoint in any direction.

22. The protective enclosure of claim 21, wherein the enclosure member and the first clamp surface comprise a single integrated component.

23. The protective enclosure of claim 21, wherein the first clamp surface is detachable from the enclosure member, when the first clamp surface is in the unclamped position.

24. The protective enclosure of claim 20, wherein the compressed portion of the first seal, when the first clamp surface is in the clamped position, forms a liquid resistant seal to resist the passage of liquid contaminants into the enclosed space beyond the clamp mouth.

25. The protective enclosure of claim 20 further comprising:
  wherein the first seal comprises a first sealing layer and a second sealing layer of compressible sealing material, wherein, when the first clamp surface is in the clamped position, the first sealing layer and the second sealing layer form the first seal in the clamp mouth by conforming the flexible surfaces of each of the first sealing layer and the second sealing layer around the entire outside surface of the portion of the conveyance within the clamp mouth.

26. The protective enclosure of claim 25, further comprising:
  a first conveyance and a second conveyance traversing the clamp mouth in the clamped position;
  wherein the first conveyance and the second conveyance are separated by a gap; and
  wherein, when the first clamp surface is in the clamped position, portions of the first sealing layer and the second sealing layer compress to conform to shapes and sizes of the first conveyance and the second conveyance to fill in the gap between the first conveyance and the second conveyance.

27. The protective enclosure of claim 20, further comprising:
  wherein the at least one conveyance extending through the wall of the enclosure member is removable through the at least one conveyance aperture, when the first clamp surface is in the unclamped position.

28. The protective enclosure of claim 20, wherein the at least one conveyance comprises one or more wires separated from one or more immediately adjacent wires.

29. The protective enclosure of claim 28, wherein the at least one conveyance comprises one or more wires separated by the electrical insulation material from the one or more immediately adjacent wires.

30. The protective enclosure of claim 29, wherein the insulation material of the at least one conveyance is moveable independently from insulation material of the one or more immediately adjacent wires.

31. The protective enclosure of claim 20, wherein the upper mouth portion comprises a first clamping surface and the lower mouth portion comprises a second clamping surface configured to compress the first seal, and wherein the first clamping surface and the second clamping are substantially parallel when the first clamping surface and the second clamping surface are in a clamped configuration.

32. The protective enclosure of claim 30, wherein the at least one conveyance is selected from the group consisting of a single core wire, a multi-strand wire, a cable, a ribbon cable, and a tube or hose encasing cables.

33. The protective enclosure of claim 21, wherein a first line extends in a lateral direction outside the enclosed space of the enclosure member at about a right angle from a plane substantially containing the aperture perimeter, and wherein the mouth centerpoint is displaced from the aperture centerpoint substantially along the first line.

* * * * *